United States Patent
Cherian et al.

(10) Patent No.: US 12,020,159 B2
(45) Date of Patent: Jun. 25, 2024

(54) TRAINING SPECTRUM GENERATION FOR MACHINE LEARNING SYSTEM FOR SPECTROGRAPHIC MONITORING

(71) Applicant: Applied Materials, Inc., Santa Clara, CA (US)

(72) Inventors: Benjamin Cherian, San Jose, CA (US); Nicholas A. Wiswell, Sunnyvale, CA (US); Jun Qian, Sunnyvale, CA (US); Thomas H. Osterheld, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/310,520

(22) Filed: May 1, 2023

(65) Prior Publication Data
US 2023/0267329 A1   Aug. 24, 2023

Related U.S. Application Data

(62) Division of application No. 16/449,104, filed on Jun. 21, 2019, now Pat. No. 11,651,207.
(Continued)

(51) Int. Cl.
*G06N 3/08* (2023.01)
*G05B 13/02* (2006.01)
(Continued)

(52) U.S. Cl.
CPC .............. *G06N 3/08* (2013.01); *G05B 13/027* (2013.01); *G05B 19/4063* (2013.01);
(Continued)

(58) Field of Classification Search
CPC .......... G06N 3/08; G06N 3/045; G06N 3/047; G06N 3/048; G05B 13/027;
(Continued)

(56) References Cited

U.S. PATENT DOCUMENTS 5,218,529 A   6/1993   Meyer et al.
5,486,129 A   1/1996   Sandhu et al.
(Continued)

FOREIGN PATENT DOCUMENTS

CN   101393015 A   3/2009
JP   H06-505815 A   6/1994
(Continued)

OTHER PUBLICATIONS

International Search Report and Written Opinion in International Appln. No. PCT/US2019/038553, Oct. 8, 2019, 11 pages.
(Continued)

*Primary Examiner* — Paul Dinh
(74) *Attorney, Agent, or Firm* — Fish & Richardson P.C.

(57) ABSTRACT

A method of generating training spectra for training of a neural network includes measuring a first plurality of training spectra from one or more sample substrates, measuring a characterizing value for each training spectra of the plurality of training spectra to generate a plurality of characterizing values with each training spectrum having an associated characterizing value, measuring a plurality of dummy spectra during processing of one or more dummy substrates, and generating a second plurality of training spectra by combining the first plurality of training spectra and the plurality of dummy spectra, there being a greater number of spectra in the second plurality of training spectra than in the first plurality of training spectra. Each training spectrum of the second plurality of training spectra having an associated characterizing value.

12 Claims, 5 Drawing Sheets

Related U.S. Application Data

(60) Provisional application No. 62/691,558, filed on Jun. 28, 2018.

(51) Int. Cl.
  *G05B 19/4063* (2006.01)
  *G05B 19/4155* (2006.01)
  *G06N 3/045* (2023.01)
  *H01L 21/66* (2006.01)

(52) U.S. Cl.
  CPC ......... *G05B 19/4155* (2013.01); *G06N 3/045* (2023.01); *H01L 22/12* (2013.01); *G05B 2219/32335* (2013.01); *G05B 2219/40066* (2013.01); *G05B 2219/41054* (2013.01); *G05B 2219/45031* (2013.01); *G05B 2219/45199* (2013.01)

(58) Field of Classification Search
  CPC ............ G05B 19/4063; G05B 19/4155; G05B 2219/32335; G05B 2219/40066; G05B 2219/41054; G05B 2219/45031; G05B 2219/45199; H01L 22/12; H01L 21/67242; H01L 21/304; H01L 21/67092; H01L 22/24; H01L 22/30; G01B 11/0616
  USPC ....................................................... 700/121
  See application file for complete search history.

(56) References Cited

U.S. PATENT DOCUMENTS

| | | | |
|---|---|---|---|
| 5,498,199 | A | 3/1996 | Karlsrud et al. |
| 5,951,373 | A | 9/1999 | Shendon et al. |
| 6,046,111 | A | 4/2000 | Robinson |
| 6,108,092 | A | 8/2000 | Sandhu |
| 6,383,058 | B1 | 5/2002 | Birang et al. |
| 6,534,407 | B2 | 3/2003 | Chang |
| 6,939,198 | B1 | 9/2005 | Swedek et al. |
| 8,954,184 | B2 | 2/2015 | Kaushal et al. |
| 11,423,331 | B2 | 8/2022 | Tamai et al. |
| 11,507,824 | B2 | 11/2022 | Cherian et al. |
| 2009/0275265 | A1 | 11/2009 | Qian et al. |
| 2010/0056023 | A1 | 3/2010 | David et al. |
| 2010/0094700 | A1 | 4/2010 | Gnojewski |
| 2010/0094790 | A1 | 4/2010 | Gnojewski |
| 2010/0120333 | A1 | 5/2010 | Sin et al. |
| 2010/0130100 | A1 | 5/2010 | David et al. |
| 2011/0300775 | A1 | 12/2011 | Zhang et al. |
| 2012/0021537 | A1* | 1/2012 | Shin ........................ H01L 22/12 438/5 |
| 2012/0096006 | A1 | 4/2012 | David et al. |
| 2012/0185813 | A1 | 7/2012 | Kaushal et al. |
| 2012/0268738 | A1 | 10/2012 | David |
| 2012/0276815 | A1 | 11/2012 | David et al. |
| 2012/0278028 | A1 | 11/2012 | David et al. |
| 2013/0237128 | A1 | 9/2013 | David et al. |
| 2014/0242730 | A1 | 8/2014 | David |
| 2014/0242881 | A1 | 8/2014 | David et al. |
| 2017/0177997 | A1 | 6/2017 | Karlinsky et al. |
| 2018/0150052 | A1 | 5/2018 | Cherian |
| 2019/0286075 | A1 | 9/2019 | Yennie et al. |
| 2019/0378012 | A1 | 12/2019 | Tripodi et al. |
| 2020/0005139 | A1 | 1/2020 | Cherian et al. |
| 2020/0005140 | A1 | 1/2020 | Cherian et al. |
| 2020/0363784 | A1 | 11/2020 | Cherian |
| 2021/0042901 | A1 | 2/2021 | Kaneko |
| 2021/0142170 | A1 | 5/2021 | Ozcan et al. |
| 2022/0207764 | A1 | 6/2022 | Liao et al. |

FOREIGN PATENT DOCUMENTS

| | | |
|---|---|---|
| JP | H08-31706 | 2/1996 |
| JP | 2001-525933 | 12/2001 |
| JP | 2010-156612 A | 7/2010 |
| JP | 2012-154711 A | 8/2012 |
| TW | 202001188 A | 1/2020 |
| WO | WO 2018/134952 A1 | 7/2018 |

OTHER PUBLICATIONS

Office Action in Japanese Appln. No. 200-571703, dated Jul. 25, 2023, 8 pages (with English translation).

Office Action in Taiwanese Appln. No. 108121965, dated Dec. 19, 2022, 10 pages (with English search report).

Office Action in Japanese Appln. No. 2020-571703, dated Jan. 16, 2024, 6 pages (with English translation).

* cited by examiner

TRAINING SPECTRUM GENERATION FOR MACHINE LEARNING SYSTEM FOR SPECTROGRAPHIC MONITORING

CROSS-REFERENCE TO RELATED APPLICATIONS

This application is a divisional of U.S. application Ser. No. 16/449,104, filed Jun. 21, 2019, whichclaims priority to U.S. Application Ser. No. 62/691,558, filed on Jun. 28, 2018, the disclosures of which are incorporated by reference.

TECHNICAL FIELD

The present disclosure relates to optical monitoring of a substrate, e.g., during processing such as chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For some applications, the filler layer is planarized until the top surface of a patterned layer is exposed. For example, a conductive filler layer can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, the filler layer is planarized until a predetermined thickness is left over an underlying layer. For example, a dielectric layer deposited can be planarized for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable profile, e.g., a substrate layer that has been planarized to a desired flatness or thickness, or a desired amount of material has been removed. Variations in the initial thickness of a substrate layer, the slurry distribution, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed. Therefore, it may not be possible to determine the polishing endpoint merely as a function of the polishing time, or to achieve a desired profile merely by applying a constant pressure.

In some systems, a substrate is monitored in-situ during polishing, e.g., by an optical monitoring system. Thickness measurements from the in-situ monitoring system can be used to adjust pressure applied to the substrate to adjust the polishing rate and reduce within-wafer non-uniformity (WIWNU).

SUMMARY

In one aspect, a method of generating training spectra for training of a neural network includes measuring a first plurality of training spectra from one or more sample substrates, measuring a characterizing value for each training spectra of the plurality of training spectra to generate a plurality of characterizing values with each training spectrum having an associated characterizing value, measuring a plurality of dummy spectra during processing of one or more dummy substrates, and generating a second plurality of training spectra by combining the first plurality of training spectra and the plurality of dummy spectra, there being a greater number of spectra in the second plurality of training spectra than in the first plurality of training spectra. Each training spectrum of the second plurality of training spectra having an associated characterizing value.

In another aspect, a method of generating training spectra for training of a neural network includes generating a first plurality of training spectra from an optical model, sending the first plurality of training spectra to a feedforward neural network, sending an output of the feedforward neural network and empirically collected spectra to a discriminatory convolutional neural network, determining that the discriminatory convolutional neural network does not discriminate between the theoretically generated spectra and empirically collected spectra, and thereafter, generating a second plurality of training spectra from the feedforward neural network.

In another aspect, a method of controlling processing of a substrate includes training an artificial neural network using the second plurality of training spectra, receiving, from an in-situ optical monitoring system, a measured spectrum of light reflected from a substrate undergoing processing that modifies a thickness of an outer layer of the substrate, generating a measured characterizing value for the measured spectrum by applying spectral values from the measured spectrum into the artificial neural network, and at least one of halting processing of the substrate or adjusting a processing parameter based on the characterizing value.

These aspects may be embodied in computer program product tangibly embodied in a non-transitory computer readable media and comprising instructions for causing a processor to carry out operations, or in a processing system, e.g., a polishing system, having a controller to carry out the operations.

Implementations of any of the aspects may include one or more of the following features.

The plurality of dummy spectra may be normalized to generate a plurality of normalized dummy spectra. Combining the first plurality of training spectra and the plurality dummy spectra may include, for each normalized dummy spectrum from the plurality of normalized dummy spectra, multiplying the normalized dummy spectrum by one of the first plurality of training spectra to generate one of the second plurality of training spectra. The one of the first plurality of training spectra may be randomly selected. The dummy substrates may be blank semiconductor substrates.

Processing may include chemical mechanical polishing. The characterizing value may be a thickness of an outermost layer of the substrate.

The artificial neural network may have a plurality of input nodes to a plurality of spectral values, an output node to output the characterizing value, and a plurality of hidden nodes connecting the input nodes to the output node. The dimensionality of the second plurality of training spectra may be reduced to generate a plurality of spectral training values, the spectra training values and the characterizing values associated with the second plurality of training spectra may be applied to the artificial neural network to train the artificial neural network. The dimensionality of the measured spectrum may be reduced to generate the spectral values to be used to generate the characterizing value.

Certain implementations may have one or more of the following advantages. The quantity of empirical polish data, e.g., the number of spectra from different device wafers, required for training of a machine learning system, e.g., a neural network, to meet predictive performance requirements can be reduced. The thickness of a layer on a substrate can be measured more accurately and/or more quickly. Within-wafer thickness non-uniformity and wafer-to-wafer thickness non-uniformity (WIWNU and WTWNU) may be reduced, and reliability of an endpoint system to detect a desired processing endpoint may be improved.

The details of one or more embodiments are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

One monitoring technique is to measure a spectrum of light reflected from a substrate being polished. A variety of techniques have been proposed to determine a characteristic value, e.g., a thickness of the layer being polished, from the measured spectrum. A possible technique is to train a neural network based on training spectra from sample device substrates and measured characteristic values for those sample substrates. After training, during normal operation, a measured spectrum from a device substrate can be input to the neural network, and the neural network can output a characteristic value, e.g., a calculated thickness of a top layer of the substrate. A motivation to use neural networks is the potential to remove the impact of under-layer film thickness on the calculated thickness of the top layer.

A problem with training a neural network in this context is that an impractically large data set may be required in order to adequately train a predictive neural network to generate thickness values from input spectra with sufficient reliability to be usable for production of integrated circuits. Small training sets suffer the risk of training the neural network based on noise in the measured spectra. Although a sufficiently large training set could provide performance similar or superior to other techniques for determining the characteristic value, it may be odious for the customer to obtain such a data set. In particular, device substrates are extraordinarily expensive; it is not commercially practical to provide a sufficient number of "spare" device substrates to perform the training.

A technique that could address these issues is to add process noise to training spectra from sample device substrates.

Another technique that could address these issues is to generate training spectra from a model.

Figure 1:
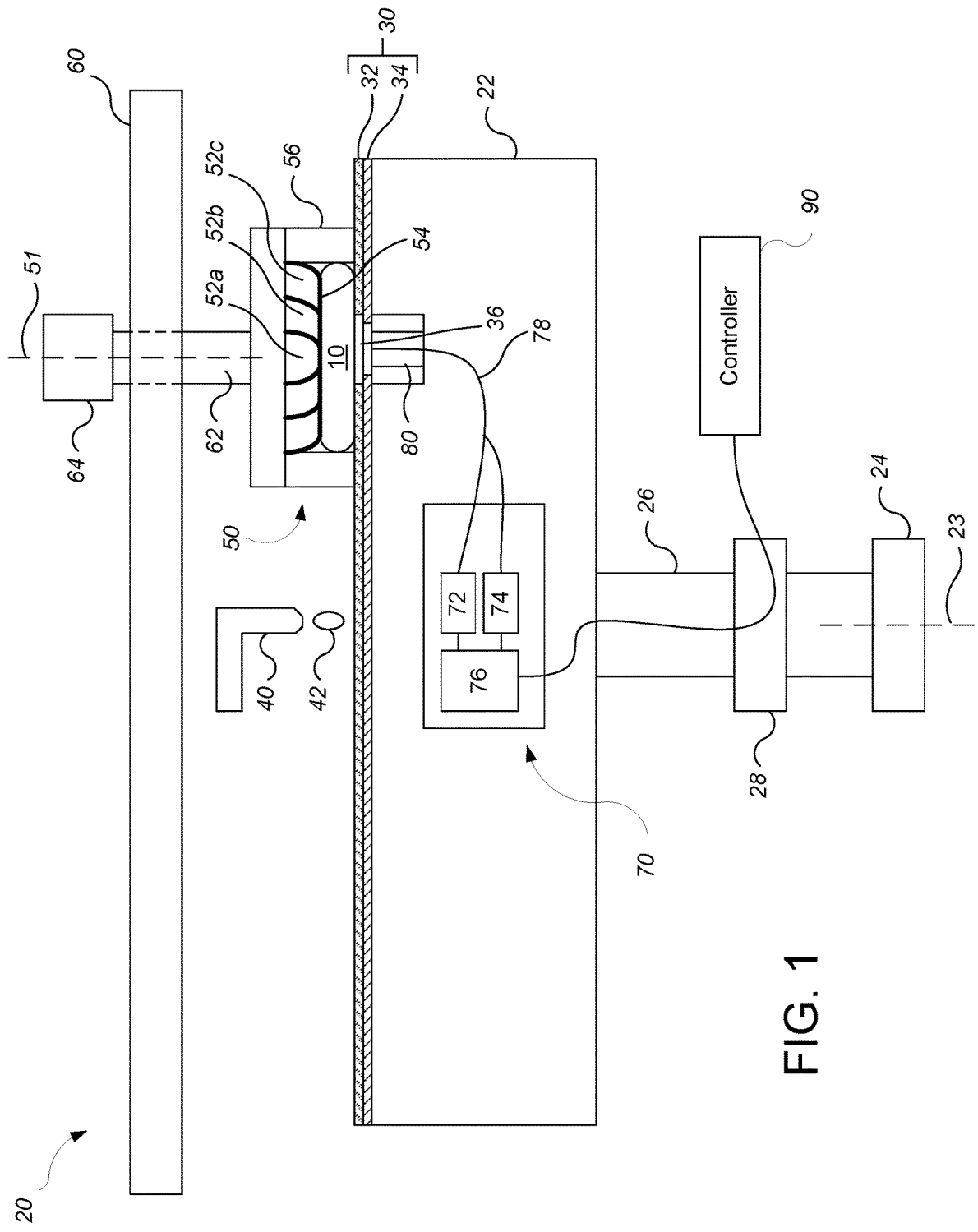
FIG. 1 illustrates a schematic cross-sectional view of an example of a polishing apparatus.

FIG. 1 illustrates an example of a polishing apparatus 20. The polishing apparatus 20 can include a rotatable disk-shaped platen 22 on which a polishing pad 30 is situated. The platen is operable to rotate about an axis 23. For example, a motor 24 can turn a drive shaft 26 to rotate the platen 22. The polishing pad 30 can be detachably secured to the platen 22, for example, by a layer of adhesive. The polishing pad 30 can be a two-layer polishing pad with an outer polishing layer 32 and a softer backing layer 34.

The polishing apparatus 20 can include a polishing liquid supply port 40 to dispense a polishing liquid 42, such as an abrasive slurry, onto the polishing pad 30. The polishing apparatus 20 can also include a polishing pad conditioner to abrade the polishing pad 30 to maintain the polishing pad 30 in a consistent abrasive state.

Figure 2:
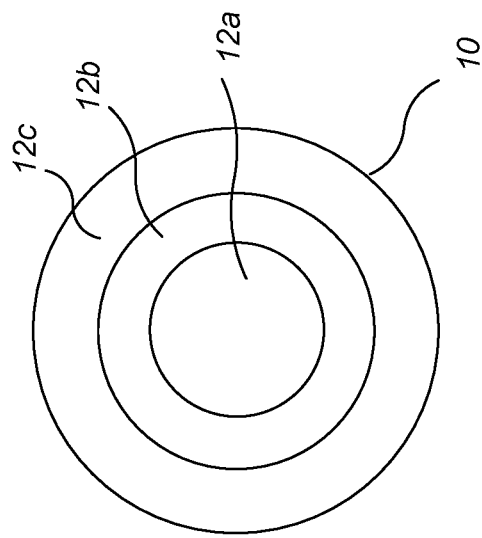
FIG. 2 illustrates a schematic top view of a substrate having multiple zones.

A carrier head 50 is operable to hold a substrate 10 against the polishing pad 30. Each carrier head 50 also includes a plurality of independently controllable pressurizable chambers, e.g., three chambers 52a-52c, which can apply independently controllable pressurizes to associated zones 12a-12c on the substrate 10 (see FIG. 2). Referring to FIG. 2, the center zone 12a can be substantially circular, and the remaining zones 12b-12c can be concentric annular zones around the center zone 12a.

Returning to FIG. 1, the chambers 52a-52c can be defined by a flexible membrane 54 having a bottom surface to which the substrate 10 is mounted. The carrier head 50 can also include a retaining ring 56 to retain the substrate 10 below the flexible membrane 54. Although only three chambers are illustrated in FIGS. 1 and 2 for ease of illustration, there could be two chambers, or four or more chambers, e.g., five chambers. In addition, other mechanisms to adjust the pressure applied to the substrate, e.g., piezoelectric actuators, could be used in the carrier head 50.

Each carrier head 50 is suspended from a support structure 60, e.g., a carousel or track, and is connected by a drive shaft 62 to a carrier head rotation motor 64 so that the carrier head can rotate about an axis 51. Optionally each carrier head can oscillate laterally, e.g., on sliders on the carousel, by motion along or track; or by rotational oscillation of the carousel itself. In operation, the platen 22 is rotated about its central axis 23, and the carrier head 50 is rotated about its central axis 51 and translated laterally across the top surface of the polishing pad 30.

The polishing apparatus also includes an in-situ monitoring system 70, which can be used to control the polishing parameters, e.g., the applied pressure in one or more of the chambers 52a-52c, to control the polishing rate of one or more of the zones 12a-12c. The in-situ monitoring system 70 generates a signal indicative of the thickness of the layer being polished in each of the zones 12a-12c. The in-situ monitoring system can be an optical monitoring system, e.g., a spectrographic monitoring system.

The optical monitoring system 70 can include a light source 72, a light detector 74, and circuitry 76 for sending and receiving signals between a controller 90, e.g., a computer, and the light source 72 and light detector 74. One or more optical fibers can be used to transmit the light from the light source 72 to a window 36 in the polishing pad 30, and to transmit light reflected from the substrate 10 to the detector 74. For example, a bifurcated optical fiber 78 can be used to transmit the light from the light source 62 to the substrate 10 and back to the detector 74. As a spectrographic system, then the light source 72 can be operable to emit white light and the detector 74 can be a spectrometer.

The output of the circuitry 76 can be a digital electronic signal that passes through a rotary coupler 28, e.g., a slip ring, in the drive shaft 26 to the controller 90. Alternatively, the circuitry 76 could communicate with the controller 90 by a wireless signal. The controller 90 can be a computing device that includes a microprocessor, memory and input/output circuitry, e.g., a programmable computer. Although illustrated with a single block, the controller 90 can be a networked system with functions distributed across multiple computers.

Figure 3:
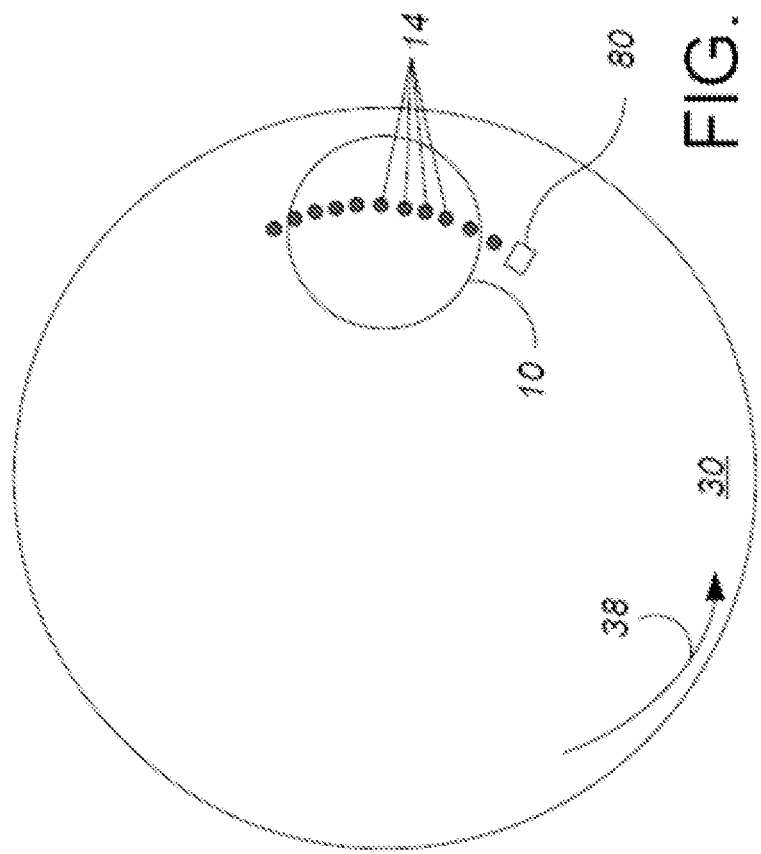
FIG. 3 illustrates is a schematic top view showing locations where in-situ measurements are taken on a first substrate.

In some implementations, the in-situ monitoring system 70 includes a sensor 80 that is installed in and rotate with the platen 22. For example, the sensor 80 could be the end of the optical fiber 78. The motion of the platen 22 will cause the sensor 80 to scan across the substrate. As shown by in FIG. 3, due to the rotation of the platen (shown by arrow 38), as the sensor 80 travels below the carrier head, the in-situ monitoring system makes measurements at a sampling frequency; as a result, the measurements are taken at locations 14 in an arc that traverses the substrate 10 (the number of points is illustrative; more or fewer measurements can be taken than illustrated, depending on the sampling frequency).

Over one rotation of the platen, spectra are obtained from different positions on the substrate 10. In particular, some spectra can be obtained from locations closer to the center of the substrate 10 and some can be obtained from locations closer to the edge. The controller 90 can be configured to calculate a radial position (relative to the center of the substrate 10) for each measurement from a scan based on timing, motor encoder information, platen rotation or position sensor data, and/or optical detection of the edge of the substrate and/or retaining ring. The controller can thus associate the various measurements with the various zones 12a-12c (see FIG. 2). In some implementations, the time of measurement of can be used as a substitute for the exact calculation of the radial position.

Returning to FIG. 1, the controller 90 can derive a characterizing value for each zone of the substrate based on the signal from the in-situ monitoring system. In particular, as polishing progresses, the controller 90 generates a sequence over time of characterizing values. The controller 90 can generate at least one characterizing value for each zone for each scan of the sensor below the substrate 10, or generate a characterizing value for each zone at a measurement frequency (which need not be the same as the sampling frequency), e.g., for polishing systems that do not scan the sensor across the substrate. In some implementations, a single characterizing value is generated per scan, e.g., multiple measurements can be combined to generate the characterizing value. In some implementations, each measurement is used to generate a characterizing value.

The characterizing value is typically the thickness of the outer layer, but can be a related characteristic such as thickness removed. In addition, the characterizing value can be a more generic representation of the progress of the substrate through the polishing process, e.g., an index value representing the time or number of platen rotations at which the measurement would be expected to be observed in a polishing process that follows a predetermined progress.

The controller 90 can use a two-step process to generate a characterizing value from a measured spectrum from the in-situ spectrographic monitoring system 70. First, the dimensionality of the measured spectrum is reduced, and then the reduced dimensionality data is input to an artificial neural network, which will output the characterizing value. By performing this process for each measured spectrum, the artificial neural network can generate a sequence of characterizing values. This sequence can include characterizing values for different radial locations on the substrate, e.g., assuming that the sensor 80 is passing below the substrate.

The combination of the in-situ spectrographic monitoring system 70 and the controller 90 can provide an endpoint and/or polishing uniformity control system 100. That is, the controller 90 can detect a polishing endpoint and halt polishing and/or adjust polishing pressures during the polishing process to reduce polishing non-uniformity, based on the series of characterizing values.

Figure 4:
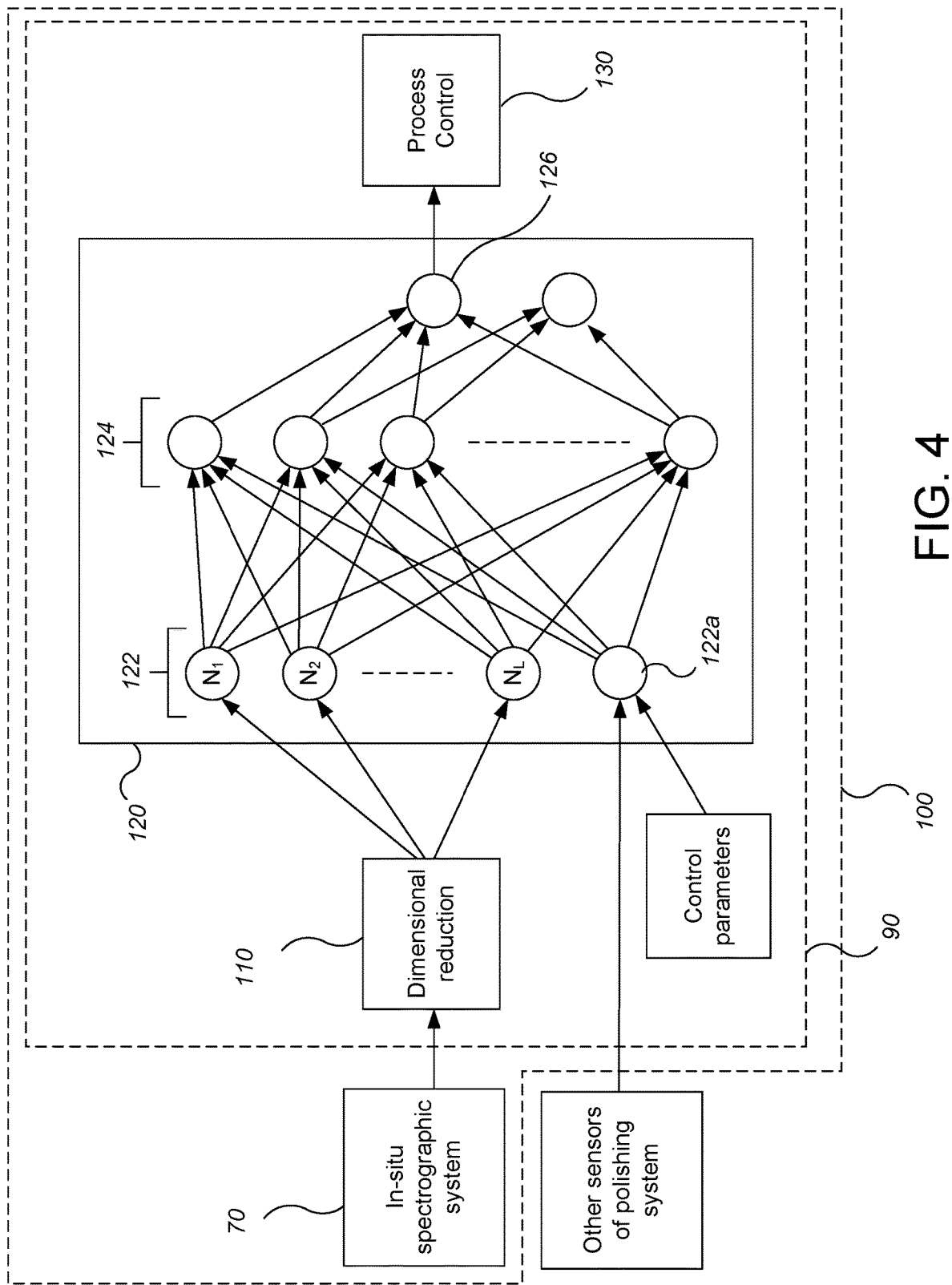
FIG. 4 illustrates a neural network used as part of the controller for the polishing apparatus.

FIG. 4 illustrates the functional blocks implemented by the controller 90, which include a dimensional reduction module 110 to carry out the dimensional reduction, a neural network 120, and a process control system 130 to adjust the polishing process, e.g., detect a polishing endpoint and halt polishing and/or adjust polishing pressures during the polishing process to reduce polishing non-uniformity, based on the series of characterizing values. As noted above, these functional blocks can be distributed across multiple computers.

The neurral network 120 includes a plurality of input nodes 122 for each principal component, a plurality of hidden nodes 124 (also called "intermediate nodes" below), and an output node 126 that will generate the characteristic value. In a neural network having a single layer of hidden nodes, each hidden node 124 can be coupled to each input node 122, and the output node 126 can be coupled to each hidden node 220. In some implementations there are multiple output nodes, one of which provides the characteristic value.

In general, a hidden node 124 outputs a value that a non-linear function of a weighted sum of the values from the input nodes 122 to which the hidden node is connected.

For example, the output of a hidden node 124, designated node k, can be expressed as:

$$\tanh(0.5 * a_{k1}(I_1) + a_{k2}(I_2) + \ldots + a_{kM}(I_M) + b_k) \quad \text{Equation 1}$$

where tanh is the hyperbolic tangent, $a_{kx}$ is a weight for the connection between the $k^{th}$ intermediate node and the $x^{th}$ input node (out of M input nodes), and $I_M$ is the value at the $M^{th}$ input node. However, other non-linear functions can be used instead of tanh, such as a rectified linear unit (ReLU) function and its variants.

The dimensional reduction module 110 will reduce a measured spectrum to a more limited number of component values, e.g., L component values. The neural network 120 includes an input node 122 for each component into which the spectrum is reduced, e.g., where the module 110 generates L component values the neural network 120 will include at least input nodes $N_1, N_2 \ldots N_L$.

Thus, where the number of input nodes corresponds the number of components to which the measured spectrum is reduced (i.e., L=M), the output $H_k$ of a hidden node 124, designated node k, can be expressed as:

$$H_k = \tanh(0.5 * a_{k1}(I_1) + a_{k2}(I_2) + \ldots + a_{kL}(I_L) + b_k)$$

Assuming that the measured spectrum S is represented by a column matrix $(i_1, i_2, \ldots, i_n)$, the output of an intermediate node 124, designated node k, can be expressed as:

$$H_k = \tanh(0.5 * a_{k1}(V_1 \cdot S) + a_{k2}(V_2 \cdot S) + \ldots + a_{kL}(V_L \cdot S) + b_k) \quad \text{Equation 2}$$

where $V_x$ is a row matrix $(v_1, v_2, \ldots, v_n)$ that will provide a transformation of the measured spectrum to a value for the $x^{th}$ component of the reduced dimensionality data (out of L components). For example, $V_x$ can be provided by the $x^{th}$ column (out of L columns) of the matrix W or W' described below, i.e., $V_x$ is the $x^{th}$ row of $W^T$. Thus, $W_x$ can represent an $x^{th}$ eigenvector from the dimensional reduction matrix.

The output node 126 can generate a characteristic value CV that is a weighted sum of the outputs of the hidden nodes. For example, this can be expressed as $$CV = C_1 * H_1 + C_2 * H_2 + \ldots + C_L * H_L$$

where $C_k$ is the weight for the output of the $k^{th}$ hidden node.

However, neural network 120 may optionally include one or more other input nodes (e.g., node 122a) to receive other data. This other data could be from a prior measurement of the substrate by the in-situ monitoring system, e.g., spectra collected from earlier in the processing of the substrate, from a measurement of a prior substrate, e.g., spectra collected during processing of another substrate, from another sensor in the polishing system, e.g., a measurement of temperature of the pad or substrate by a temperature sensor, from a polishing recipe stored by the controller that is used to control the polishing system, e.g., a polishing parameter such as carrier head pressure or platen rotation rate use for polishing the substrate, from a variable tracked by the controller, e.g., a number of substrates since the pad was changed, or from a sensor that is not part of the polishing system, e.g., a measurement of a thickness of an underlying films by a metrology station. This permits the neural network 120 to take into account these other processing or environmental variables in calculation of the characterizing value.

Before being used for, e.g., device wafers, the dimensional reduction module 110 and the neural network 112 need to be configured.

As part of a configuration procedure for the dimensional reduction module 110, the controller 90 can receive a plurality of training spectra and a characterizing value, e.g., thickness, associated with each training spectrum of the plurality of training spectra. For example, training spectra can be measured at particular locations on one or more sample device substrates. In addition, measurements of the thickness at the particular locations can be performed with metrology equipment, e.g., a contact profilometer or ellipsometer. A thickness measurement can thus be associated with the training spectrum from the same location on a sample device substrate. The plurality of training spectra can include, for example, five to one-hundred training spectra.

As another part of the configuration procedure, a plurality of dummy spectra can be measured during polishing of one or more bare dummy semiconductor substrates, e.g., bare silicon wafers. The plurality of dummy spectra can include, for example, fifty to one-thousand dummy spectra. These dummy spectra can be normalized, e.g., by dividing each dummy spectrum by a reference spectrum for a substrate of the same semiconductor material, e.g., silicon. Each normalized dummy spectrum can then be multiplied by a randomly selected training spectrum from the plurality of training spectra. This will generate an augmented set of training spectra.

This process has the effect of adding the pure process noise collected over the entire polishing run of the dummy substrates to the training set. The augmented set of training spectra can provide a sufficiently large training set to adequately train the neural network. On the other hand, distributing process noise randomly throughout the augmented training set should prevent the neural network from training on changes in that process noise.

Figure 5:
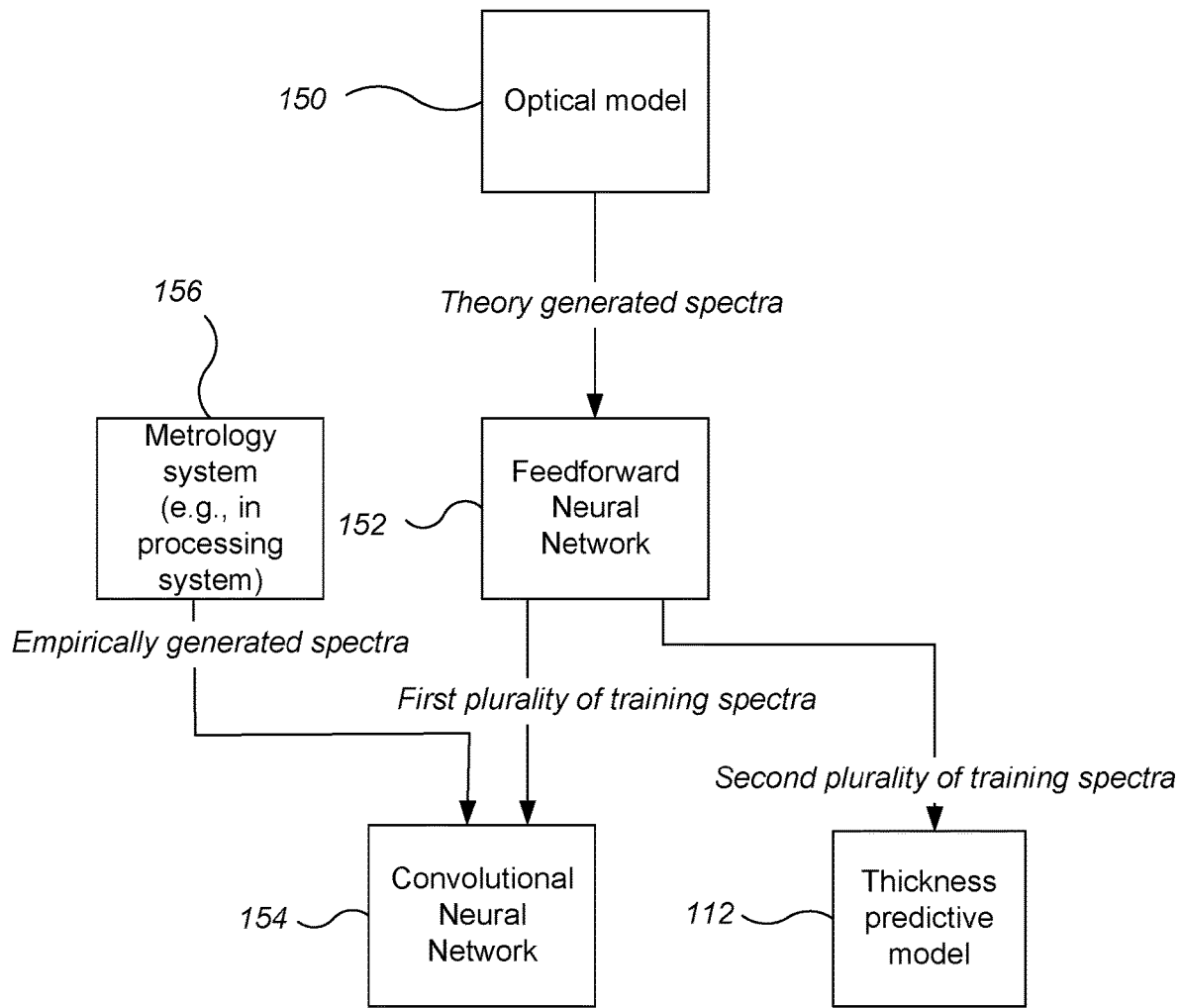
FIG. 5 is a schematic diagram of components used to generate training spectra.

As an alternative to measuring spectra from sample device substrates (and dummy spectra from dummy semiconductor substrates), training spectra could be generated from an optical model, e.g., in conjunction with a feedforward neural network. In particular, referring to FIG. 5, a first-principles theoretical optical model 150 could be used to generate theory-generated initial spectra based on randomized thickness within the film stack of the product wafer. That is, for each of a series of spectra to be generated by the model 150, each of one or more layers within the film stack represented in the model can be randomly assigned a thickness by the model 150. For any particular layer, the random assignment of the thickness can be based on a linear or bell-curve distribution between a minimum thickness value and maximum thickness value, which can be set by the operator.

These theory-generated initial spectra can be sent through a feedforward neural network (FFN) 152. The feedforward neural network 152 is configured to modify each theory-generated spectrum by adding a noise component to the theoretically generated spectrum to generate a modified theoretically generated spectrum, which can serve as a training spectrum (or potential training spectrum). This generates a plurality of modified theoretically generated spectrum, which can serve as training spectra (or potential training spectra). There may be a greater number of potential training spectra than theory generated spectra, e.g., if the same training spectrum is fed to the FNN 152 multiple times but using different noise components.

In a training mode, the output of the feedforward neural network 152, e.g., the modified theoretically generated training spectra (which provides a first plurality of training spectra), can then be sent to a discriminatory convolutional neural network (DCNN) 154. In effect, the feedforward neural network 152 and the discriminatory convolutional neural network 154 act as generative adversarial network to train the feedforward neural network 152.

In particular, empirically collected spectra can be interspersed with the plurality of potential training spectra that are generated by the FFN 152. The empirically collected spectra can be received from a metrology system 156, e.g., a spectrometer. The discriminatory convolutional neural network 154 attempts to determine whether the spectra was theoretically generated or empirically detected. The accuracy level of the DCNN 154 can be used as input to the FNN 152 for training of the FNN 152. Reduced accuracy of the DCNN 154 indicates improvement by the FFN 152. Once the discriminatory convolutional neural network 154 is substantially unable to determine empirical spectra from theory-generated spectra at a rate significantly greater than chance, e.g., less than 55% or less than 51% chance of correctly identifying an empirically generated spectrum assuming that the half of the spectra are empirically generated, the FFN 152 has been trained. Then the feedforward neural network 152 can be used to generate an arbitrarily large set of training spectra (which provides a second plurality of training spectra) for the thickness predictive model, e.g., the neural network 112.

As a further part of the configuration procedure for the dimensional reduction module 110, the controller 90 can generate a group of eigenvectors for the covariant matrix of the data set of the training spectra. Once the group of eigenvectors have been generated, the eigenvectors can be ranked and a pre-set number of eigenvectors having the largest eigenvalues, e.g., the top four to eight, can be retained.

Ranking the eigenvectors by their associated eigenvalues shows the directions in which the dataset varies the most. A projection of a measured spectrum onto the highest ranked eigenvectors provides an efficient representation of the original vector in a significantly reduced basis.

As explanation, each training spectrum can be represented by a matrix:

$$R=(i_1, i_2, \ldots, i_n),$$

where $i_j$ represents the light intensity at the $j^{th}$ wavelength of a total of n wavelengths. The spectrum can include, for example, two-hundred to five-hundred intensity measurements; n can be two-hundred to five-hundred.

Suppose that m training spectra are generated, the m matrixes R can be combined to form the following matrix:

$$A = \begin{pmatrix} i_{11} & i_{12} & \ldots & i_{1n} \\ i_{21} & i_{22} & \ldots & i_{2n} \\ \vdots & \vdots & \ldots & \vdots \\ i_{m1} & i_{m2} & \ldots & i_{mn} \end{pmatrix},$$

where $i_{jk}$ represents the light intensity at the $k^{th}$ wavelength of the $j^{th}$ training spectrum. Each row of the matrix A represents a training spectrum (e.g., a measurement at one location on a substrate).

A dimensional reduction process, such as principal component analysis (PCA), is applied to the matrix A. PCA performs an orthogonal linear transformation that transforms the data in the A matrix (m×n dimensions) to a new coordinate system such that the greatest variance by any projection of the data comes to lie on the first coordinate (called the first principal component), the second greatest variance on the second coordinate, and so on. Mathematically, the transformation is defined by a set of p-dimensional vectors of weights $w_k=(w_{k1}, w_{k2}, \ldots, w_{kp})$ that map each m-dimensional row vector $A_i$ of the matrix A to a new vector of principal component scores $t_i=t_{k1}, t_{k2}, \ldots, t_{ip}$, where $t_{ki}$ is:

$$t_{ki}=A_i \cdot w_k.$$

Each vector $w_k$ is constrained to be a unit vector. As a result, the individual variables of $t_i$ inherits the maximum possible variance from the matrix A. The decomposition of the matrix A can be written as:

$$T=AW,$$

where W is a n-by-p matrix whose columns are the eigenvectors of $A^T A$.

Details of PCA are also discussed in Functional Data Analysis by James Ramsay and B. W. Silverman (Springer; 2nd edition (Jul. 1, 2005)), and Principal Component Analysis by I. T. Jolliffe (Springer; 2nd edition (Oct. 2, 2002).

Instead of PCA, the controller can use SVD (Singular Value Decomposition), which is a generalized eigen-decomposition of the training spectrum dataset, or ICA (Independent Component Analysis), in which a pre-specified number of statistically independent signals are found whose additive combinations give rise to the training spectrum dataset.

Next, the dimensionality can be reduced by keeping only the highest ranked eigenvectors. In particular, instead of p principal components, a total of L principal components, with L being an integer between 0 and p, e.g., three to ten, can be kept. For example, the T matrix can be reduced to a m×L matrix T', e.g., by keeping using the leftmost L columns of the T matrix. Similarly, the W matrix can be reduced to a n×L matrix W', e.g., by keeping the leftmost L columns of the W matrix.

As another example, a non-linear dimensionality reduction technique such as autoencoding could be used. An autoencoder used could be implemented as a neural network which attempts to reconstruct the original input (which may have a dimensionality of N) by passing it through multiple layers. One of the intermediate layers will have a reduced number of hidden neurons. The network is trained by minimizing the difference between the output layer and input layer. The values of the hidden neurons can be considered to be the reduced dimensionality spectra in such a case. This technique can provide an advantage over PCA and other similar techniques due to the fact that the dimensionality reduction is no longer a linear process.

As of the configuration procedure for the neural network 120, the neural network 120 is trained using the component values and characteristic value for each training spectrum.

Each row of the matrix T' corresponds to one of the training spectra, and is thus associated with a characteristic value. While the neural network 120 is operating in a training mode, such as a backpropagation mode, the values $(t_1, t_2, \ldots, t_L)$ along a particular row are fed to the respective input nodes $N_1, N_2 \ldots N_L$ for the principle components while the characteristic value V for the row is fed to the output node 126. This can be repeated for each row. This sets the values for $a_{k1}$, etc., in Equations 1 or 2 above.

Determination of the principal components, e.g., by PCA, SVD, ICA, etc., can be performed using a larger data than the data set used for training of the neural network. That is, the number of spectra used for determination of the principal components can be larger than the number of spectra having known characteristic values that are used for training.

The system is now ready for operation. A spectrum is measured from a substrate during polishing using the in-situ spectrographic monitoring system 70. The measured spectrum can be represented by a column matrix $S=(i_1, i_2, \ldots, i_n)$, where $i_j$ represents the light intensity at the jth wavelength of a total of n wavelengths. The column matrix S is multiplied by the W' matrix to generate a column matrix, i.e., $S \cdot W'=P$, where $P=(P_1, P_2, \ldots, P_L)$, with $P_i$ representing the component value of the $i^{th}$ principle component.

While the neural network 120 is used in an inference mode, these values $(P_1, P_2, \ldots, P_L)$ are fed as inputs to the respective input nodes $N_1, N_2, \ldots N_L$. As a result, the neural network 120 generates a characteristic value, e.g., a thickness, at the output node 126.

The combined calculation performed by the dimensional reduction module 110 and the neural network 120 to generate the characteristic value CV can be expressed as follows:

$$CV=C_1*\tanh(0.5(N_1 \cdot S)+0.5b_1)+C_2*\tanh(0.5(N_2 \cdot S)+0.5b_2)+ \ldots +C_L*\tanh(0.5(N_L \cdot S)+0.5b_L)$$

where $N_k=(a_{k1}V_1+a_{k2}V_2+ \ldots +a_{kL}V_L)$ with the weights $a_{ki}$ being the weights set by the neural network 120 and the vectors $V_i$ being the eigenvectors determined by the dimensional reduction module 110.

The architecture of the neural network 120 can vary in depth and width. For example, although the neural network 120 is shown with a single column of intermediate nodes 124, it could include multiple columns. The number of intermediate nodes 124 can be equal to or greater than the number of input nodes 122.

As noted above, the controller 90 can associate the various measured spectra with different zones 12a-12c (see FIG. 2) on the substrate 10. The output of each neural network 120 can be classified as belonging to one of the zones based on the position of the sensor on the substrate 10 at the time the spectrum is measured. This permits the controller 90 to generate a separate sequence of characteristic values for each zone.

The characterizing values are fed to the process control module 130, e.g., a characteristic value for each zone can then be used by the process control module 130 to adjust process parameters to reduce non-uniformity across the substrate and/or to detect the polishing endpoint.

The reliability of the computed characteristic value can be evaluated by reconstructing the spectrum and then determining a difference between the reconstructed spectrum and the original measured spectrum. For example, once the principal component values ($P_1, P_2, \ldots, P_L$), have been calculated, a reconstructed spectrum Q can be generated by $P \cdot W'^T = Q$. A difference between P and S can then be calculated, e.g., using sum of squared differences. If the difference is large, the associated characteristic value can be ignored by the process module 130.

Figure 6:
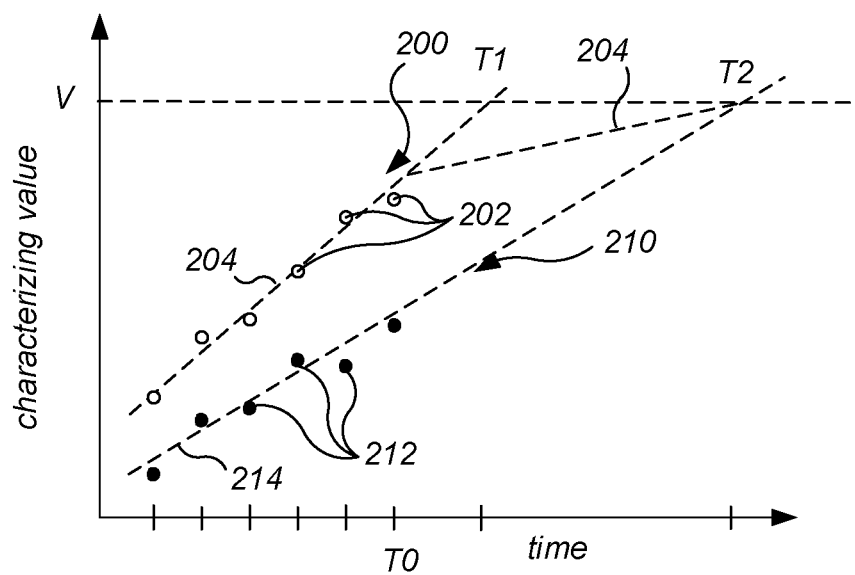
FIG. 6 illustrates a graph of characterizing values output by the control system as a function of time.

For example, referring to FIG. 6, a first function 204 can be fit to the sequence 200 of characteristic values 202 for a first zone, and a second function 214 can be fit to the sequence 210 of characteristic values 212 for a second zone. The process controller can calculate the times T1 and T2 at which the first and second functions are projected to reach a target value V, and calculate an adjusted processing parameter, e.g., an adjusted carrier head pressure, that will cause one of the zones to be polished at a revised rate (shown by line 220) such that the zones reach the target at approximately the same time.

A polishing endpoint can be triggered by the process controller 130 at the time that a function indicates the characteristic values reaches the target value V.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine-readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing system can be a linear polishing system, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used relative orientation or positioning of the components; it should be understood that the polishing surface and substrate can be held in a vertical orientation or some other orientation with respect to gravity.

Although the description above has focused on chemical mechanical polishing, the control system can be adapted to other semiconductor processing techniques, e.g., etching or deposition, e.g., chemical vapor deposition. In addition, the technique can be applied to an in-line or stand-alone metrology system rather than in-situ monitoring.

Particular embodiments of the invention have been described. Other embodiments are within the scope of the following claims.

What is claimed is:

1. A method of controlling processing of a substrate, comprising:
    measuring a first plurality of training spectra from one or more sample substrates;
    measuring a characterizing value for each training spectrum of the first plurality of training spectra to generate a plurality of characterizing values with each training spectrum having an associated characterizing value;
    measuring a plurality of dummy spectra during processing of one or more dummy substrates;
    generating a second plurality of training spectra by combining the first plurality of training spectra and the plurality of dummy spectra, there being a greater number of spectra in the second plurality of training spectra than in the first plurality of training spectra, each training spectrum of the second plurality of training spectra having an associated characterizing value; and
    training an artificial neural network using the second plurality of training spectra, the artificial neural network having a plurality of input nodes to a plurality of spectral values, an output node to output the characterizing value, and a plurality of hidden nodes connecting the input nodes to the output node;
    receiving, from an in-situ optical monitoring system, a measured spectrum of light reflected from a substrate undergoing processing that modifies a thickness of an outer layer of the substrate;
    generating a measured characterizing value for the measured spectrum by applying spectral values from the measured spectrum into the artificial neural network; and
    at least one of halting processing of the substrate or adjusting a processing parameter based on the characterizing value.

2. The method of claim 1, wherein the processing comprises chemical mechanical polishing.

3. The method of claim 1, wherein the dummy substrates comprises blank semiconductor substrates.

4. The method of claim 1, comprising normalizing the plurality of dummy spectra to generate a plurality of normalized dummy spectra.

5. The method of claim 4, wherein combining the first plurality of training spectra and the plurality dummy spectra comprises, for each normalized dummy spectrum from the plurality of normalized dummy spectra, multiplying the normalized dummy spectrum by one of the first plurality of training spectra to generate one of the second plurality of training spectra.

6. The method of claim 5, comprising multiplying the normalized dummy spectrum by a randomly selected one of the first plurality of training spectra.

7. The method of claim 1, wherein the characterizing value comprises a thickness of an outermost layer of the substrate.

8. A computer program product for controlling processing of a substrate, the computer program product tangibly embodied in a non-transitory computer readable media and comprising instructions for causing a processor to:
   receive a first plurality of training spectra and plurality of characterizing values, each training spectrum of the first plurality of training spectra having an associated characterizing value from the plurality of characterizing values;
   receive a plurality of dummy spectra representing spectra obtained from processing of one or more dummy substrates;
   generate a second plurality of training spectra by combining the first plurality of training spectra and the plurality of dummy spectra, there being a greater number of spectra in the second plurality of training spectra than in the first plurality of training spectra, each training spectrum of the second plurality of training spectra having an associated characterizing value;
   train an artificial neural network using the second plurality of training spectra, the artificial neural network having a plurality of input nodes to a plurality of spectral values, an output node to output the characterizing value, and a plurality of hidden nodes connecting the input nodes to the output node;
   receive, from an in-situ optical monitoring system, a measured spectrum of light reflected from a substrate undergoing processing that modifies a thickness of an outer layer of the substrate;
   generate a measured characterizing value for the measured spectrum by applying spectral values from the measured spectrum into the artificial neural network; and
   at least one of halt processing of the substrate or adjust a processing parameter based on the characterizing value.

9. The computer program product of claim 8, comprising instructions to reduce a dimensionality of the second plurality of training spectra to generate a plurality of spectral training values and to apply the spectra training values and the characterizing values associated with the second plurality of training spectra to the artificial neural network to train the artificial neural network.

10. The computer program product of claim 8, wherein the instructions to generate the measured characterizing value comprise instructions to reduce a dimensionality of the measured spectrum to generate the spectral values.

11. The computer program product of claim 8, wherein the measured characterizing value comprises a thickness of an outermost layer of the substrate.

12. The computer program product of claim 8, wherein the processing comprises chemical mechanical polishing.

* * * * *